(12) United States Patent
Jung et al.

(10) Patent No.: US 7,180,340 B2
(45) Date of Patent: Feb. 20, 2007

(54) FREQUENCY MULTIPLIER CAPABLE OF ADJUSTING DUTY CYCLE OF A CLOCK AND METHOD USED THEREIN

(75) Inventors: Gun-Ok Jung, Suwon (KR); Sung-Bae Park, Seongnam (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 10/655,024

(22) Filed: Sep. 5, 2003

(65) Prior Publication Data
US 2004/0150438 A1 Aug. 5, 2004

(30) Foreign Application Priority Data
Feb. 4, 2003 (KR) .................. 10-2003-0006790

(51) Int. Cl.
*H03B 19/00* (2006.01)

(52) U.S. Cl. .................. 327/116; 327/119; 327/175

(58) Field of Classification Search ............. 327/116, 327/119, 122, 170, 172, 175–176; 377/47–48
See application file for complete search history.

(56) References Cited

U.S. PATENT DOCUMENTS

| 5,121,015 A | | 6/1992 | Ngo ........................... 327/281 |
| 5,138,320 A | * | 8/1992 | Ngo et al. .................. 341/173 |
| 5,471,165 A | | 11/1995 | Liedberg ..................... 327/250 |
| 5,783,967 A | * | 7/1998 | Takaya ........................ 329/303 |
| 5,955,902 A | * | 9/1999 | Takada et al. ............... 327/116 |
| 6,005,420 A | * | 12/1999 | Yoshizawa et al. .......... 327/116 |
| 6,150,855 A | | 11/2000 | Marbot ........................ 327/116 |
| 6,295,328 B1 | * | 9/2001 | Kim et al. ................... 327/158 |
| 6,351,756 B1 | | 2/2002 | Taniyoshi .................... 708/103 |

(Continued)

FOREIGN PATENT DOCUMENTS

GB    2 199 457    7/1988

(Continued)

OTHER PUBLICATIONS

Combined Search and Examination Report for GB Appl. No. 0328506.1 dated May 7, 2004.

(Continued)

*Primary Examiner*—Timothy P. Callahan
*Assistant Examiner*—Cassandra Cox
(74) *Attorney, Agent, or Firm*—Harness, Dickey & Pierce, P.L.C.

(57) ABSTRACT

Provided is a frequency multiplier including a delay circuit, an XOR gate, and a control circuit and a method of operating such a frequency multiplier to adjust the duty cycle of a clock signal. During operation of the frequency multiplier the delay circuit receives a first clock signal and generates a delayed clock signal. The XOR gate receives the first clock signal and the delayed clock signal, performs an XOR operation on the received signals and outputs a second clock signal that has a frequency that is a multiple of the first clock signal. The control circuit monitors the phase difference between the first clock signal and the delayed clock signal and outputs a control signal corresponding to the detected phase difference to the delay circuit to adjust the time delay applied to the first clock signal by the delay circuit.

21 Claims, 7 Drawing Sheets

U.S. PATENT DOCUMENTS

| | | | |
|---|---|---|---|
| 6,400,197 B2 | 6/2002 | Lai et al. | 327/161 |
| 6,426,660 B1 * | 7/2002 | Ho et al. | 327/175 |
| 6,707,330 B2 * | 3/2004 | Nakanishi | 327/158 |

FOREIGN PATENT DOCUMENTS

| | | |
|---|---|---|
| JP | 9083361 | 3/1997 |
| JP | 10-145191 | 5/1998 |
| JP | 2000059183 | 2/2000 |
| KR | 1998-056142 | 9/1998 |
| TW | 432799 | 5/2001 |
| TW | 439363 | 6/2001 |

OTHER PUBLICATIONS

Taiwanese Office Action w/ translation dated Feb. 14, 2005.

* cited by examiner

FREQUENCY MULTIPLIER CAPABLE OF ADJUSTING DUTY CYCLE OF A CLOCK AND METHOD USED THEREIN

CROSS REFERENCE TO RELATED APPLICATION

This application claims priority under 35 U.S.C. § 119 from Korean Patent Application No. 2003-6790, filed on Feb. 4, 2003, in the Korean Intellectual Property Office, the disclosure of which is hereby incorporated by reference in its entirety.

BACKGROUND OF THE INVENTION

1. Field of the Invention

The present invention relates to a frequency multiplier and, more particularly, to a frequency multiplier capable of multiplying the frequency of an input clock signal and adjusting the duty cycle of the input clock signal.

2. Description of the Related Art

Frequency multipliers are often used to multiply the frequency of an input clock signal for use with synchronous semiconductor memory devices. Since the frequency of the input clock signal is directly related to the operating speed of elements of the synchronous semiconductor memory devices, it is advantageous to be able to convert a low frequency clock signal into a high frequency clock signal.

In general, the frequency multiplier includes a delay circuit and an XOR gate. The delay circuit delays the input clock signal by a time delay and outputs the delayed clock signal. The XOR gate performs an XOR operation using the clock signal and the delayed clock signal as inputs, and outputs a clock signal with a multiplied frequency.

FIG. 1 is a timing diagram for explaining the conventional procedure for doubling the frequency of an input clock signal to produce an output clock signal having a doubled.

Referring to FIG. 1, after the delay circuit (not shown) of the frequency multiplier delays an input clock signal CLK by a predetermined time delay and outputs a delayed clock signal CLKD, an XOR gate (not shown) of the frequency multiplier performs an XOR operation on the input clock signal CLK and the delay clock signal CLKD. This results in an output clock signal CLKX2 with a frequency twice that of the input clock signal CLK. In this manner, frequency multipliers can be used to multiply the frequency of an input clock signal CLK by a factor of two or more.

The duty cycle of a clock signal is one of the significant factors in operation of a synchronous semiconductor memory device with a high operating speed, i.e., operating in synchronization with a high frequency clock signal. In particular, with the introduction of double data rate (DDR) semiconductor memory devices, an accurate duty cycle of a clock signal becomes a key operation factor of such a semiconductor memory device.

As shown in FIG. 1, since the output clock signal CLKX2 is generated by performing the XOR operation on the input clock signal CLK and the delayed clock signal CLKD, the accurate duty cycle of the output clock signal CLKX2 is subject to the delayed clock signal CLKD. In other words, if the delayed clock signal CLKD is generated by delaying the input clock signal CLK by a time delay equal to a quarter cycle of the input clock signal CLK, the duty cycle of the output clock signal CLKX2 equals 50%. As such, the duty cycle of the output clock signal CLKX2 is obtained based on a phase difference between the input clock signal CLK and the delayed clock signal CLKD.

SUMMARY OF THE INVENTION

An exemplary embodiment of the present invention provides a frequency multiplier capable of adjusting the duty cycle of a clock signal by controlling the time delay applied by a delay circuit in response to a control signal, thereby adjusting the duty cycle of a clock signal with a multiplied frequency.

An exemplary embodiment of the present invention also provides a method of adjusting the duty cycle of a clock signal with a multiplied frequency by controlling the time delay applied by a delay circuit in response to a control signal.

One exemplary embodiment of the present invention provides a frequency multiplier that receives a first clock signal having a predetermined frequency, multiplies the predetermined frequency of the first clock signal, and outputs a second clock signal. The frequency multiplier comprises a delay circuit, an XOR gate, and a control circuit. The delay circuit receives the first clock signal and outputs a delayed clock signal by delaying the first clock signal to achieve a predetermined time delay. The XOR gate receives the first clock signal and the delayed clock signal, performs an XOR operation on the first clock signal and the delayed clock signal, and outputs the second clock signal. The control circuit detects a phase difference between the first clock signal and the delayed clock signal, and outputs a control signal to the delay circuit corresponding to the detected phase difference. The control signal controls the time delay applied to the first clock signal in the delay circuit.

An exemplary embodiment utilizes a control signal including a plurality of bit signals corresponding to the detected phase difference. The control circuit comprises a phase detector that receives the first clock signal and the delayed clock signal, and outputs a first voltage and a second voltage with respect to the detected phase difference between the first clock signal and the delayed clock signal, a comparator that receives the first voltage and the second voltage, compares the first voltage and the second voltage, and outputs a logic signal having a predetermined logic state based on the compared result, and a counter that outputs the control signal in synchronization with the first clock signal. The control signal is increased or decreased in response to the logic signal output from the comparator.

An exemplary embodiment of the phase detector comprises a first voltage control unit that receives the first clock signal and the delayed clock signal, controls a level of the first voltage in response to logic states of the first clock signal and the delayed clock signal, and includes a reset signal generating unit that generates a reset signal using the first clock signal and the delayed clock signal, a reset unit that maintains the first voltage and the second voltage at a same level in response to the reset signal, and a second voltage control unit that receives the reset signal and controls the level of the second voltage in response to the reset signal.

In an exemplary embodiment of the invention, when the first clock signal has a first logic state and the delayed clock signal has a second logic state, the first voltage control unit operates to increase the level of the first voltage. When the first clock signal and the delayed clock signal have the first logic state, the first voltage control unit operates to decrease the level of the first voltage. When the first clock signal has the second logic state, the first voltage control unit operates to reset the first voltage and the second voltage and maintain the same level as each other.

The delay circuit typically receives the control signal output from the counter and outputs the delayed clock signal by delaying the first clock signal using a time delay corresponding to the logic state of the control signal.

In an exemplary embodiment, the delay circuit may comprise a plurality of inversion circuit groups serially connected between input and output terminals of the delay circuit, in which each inversion circuit group includes a plurality of inversion circuits connected in parallel, and the time delay applied by each inversion circuit group is controlled in response to activation of the inversion circuits, with at least one inversion circuit being activated in response to the control signal.

Another exemplary embodiment of the present invention provides a frequency multiplier that receives a first clock signal, multiplies the frequency of the first clock signal, and outputs a second clock signal. The frequency multiplier comprises a delay circuit, a logic circuit, a phase detector, a comparator, and a counter. The delay circuit delays the first clock signal by a time delay and outputs a resulting signal. The logic circuit receives the first clock signal and the resulting signal of the delay circuit, synthesizes the first clock signal and the resulting signal of the delay circuit, and outputs the second clock signal. The phase detector detects a phase difference between the first clock signal and the resulting signal of the delay circuit, and outputs a first voltage based on the detected result and a second voltage as a reference voltage. The comparator compares the first voltage and the second voltage and outputs a logic signal based on the compared result. The counter outputs a digital signal of N-bits that is synchronized with the first clock signal and is used by the delay circuit for controlling the time delay. The logic state of each of the N-bits in the digital control signal determine the value of the digital signal output from the counter and will be adjusted to increase, maintain or decrease the value of the digital signal in response to the logic signal from the comparator.

Another exemplary embodiment of the present invention provides a frequency multiplication method in which a first clock signal having a predetermined frequency is received and multiplied to produce a second, higher frequency clock signal. The frequency multiplication method comprising receiving the first clock signal and outputting a delayed clock signal by delaying the first clock signal using a time delay, receiving the first clock signal and the delayed clock signal, performing an XOR operation on the first clock signal and the delayed clock signal, and outputting a second clock signal, and detecting a phase difference between the first clock signal and the delayed clock signal and outputting a control signal to a delay circuit corresponding to the detected phase difference. The control signal is then used to control the time delay applied to the first clock signal by the delay circuit.

BRIEF DESCRIPTION OF THE DRAWINGS

Exemplary embodiments of the devices and methods that may be utilized to practice the present invention are addressed more fully below with reference to the attached drawings in which.

DETAILED DESCRIPTION OF EXEMPLARY EMBODIMENTS

Figure 1:
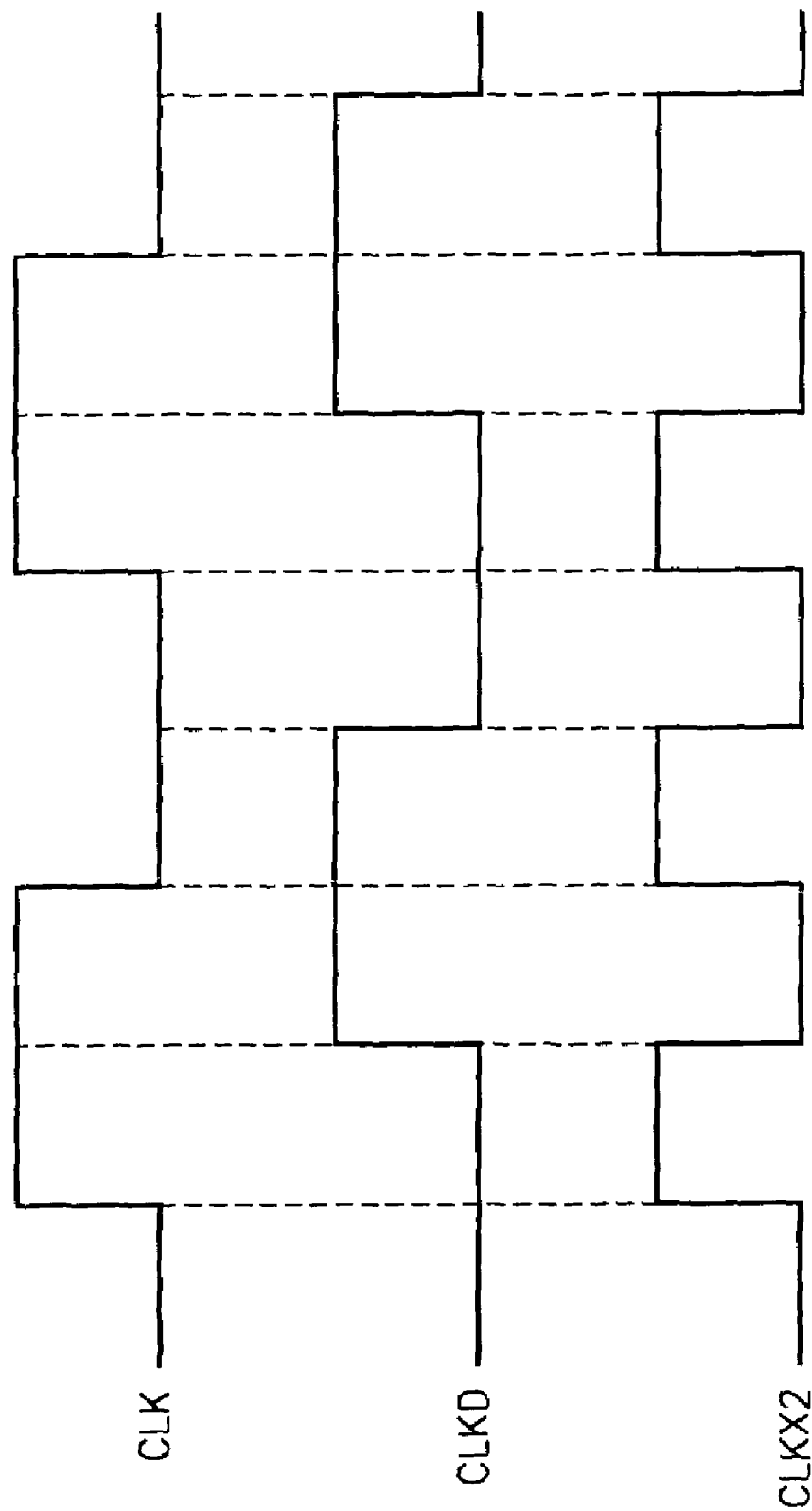
FIG. 1 is a timing diagram for explaining a conventional procedure for doubling the frequency of an input clock signal.

The invention will now be described more fully with reference to the accompanying drawings, in which exemplary embodiments of the present invention are shown, and using, where possible, identical reference numerals to designate identical or corresponding elements that are common among the figures.

Figure 2:
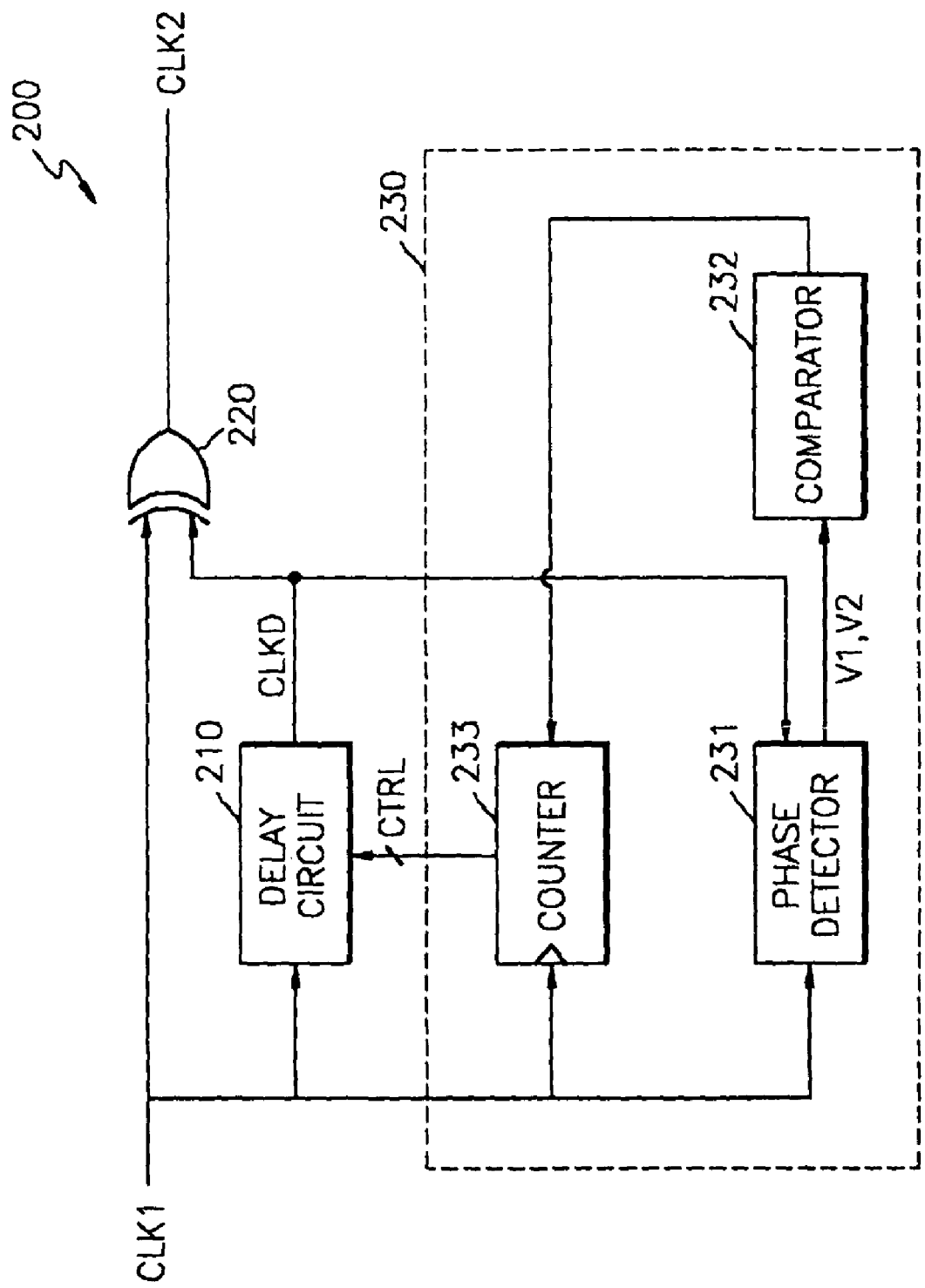
FIG. 2 is a block diagram showing a frequency multiplier capable of adjusting the duty cycle of a clock signal according to an exemplary embodiment of the present invention.

FIG. 2 is a block diagram showing a frequency multiplier capable of adjusting the duty cycle of a clock signal according to an exemplary embodiment of the present invention. As illustrated in FIG. 2, a frequency multiplier 200 includes a delay circuit 210, an XOR device 220, and a control circuit 230. The delay circuit 210 receives a first clock signal CLK1 and generates a delayed clock signal CLKD. CLKD having a phase difference relative to CLK1. The XOR device 220 receives the first clock signal CLK1 and the delayed clock signal CLKD and outputs a second clock signal CLK2. The second clock signal CLK2 is generated by performing an XOR operation on the first clock signal CLK1 and the delayed clock signal CLKD.

The control circuit 230 receives the first clock signal CLK1 and the delayed clock signal CLKD and outputs a control signal CTRL to the delay circuit 210. The control circuit 230 detects the phase difference between the first clock signal CLK1 and the delayed clock signal CLKD and, based on the detected result, outputs a control signal CTRL for controlling the time delay produced by the delay circuit 210.

The control circuit 230 includes a phase detector 231, a comparator 232, and a counter 233. The phase detector 231 receives the first clock signal CLK1 and the delayed clock signal CLKD, detects the phase difference between the signals, and outputs a first voltage V1 and a second voltage V2 to the comparator 232 reflecting the detected phase difference.

The comparator 232 compares the first voltage V1 and the second voltage V2, and outputs to the counter 233 a logic signal having a predetermined logic state based on the result of the comparison. When the difference between the first voltage V1 and the second voltage V2 is greater than a predetermined value, the comparator 232 outputs a signal for increasing the output signal of the counter 233. When the difference between the first voltage V1 and the second voltage V2 is less than the predetermined value, the comparator 232 outputs a signal for decreasing the output signal of the counter 233.

The counter 233 receives the signal output from the comparator 232 and outputs the control signal CTRL to the delay circuit 210 in synchronization with the first clock signal CLK1. The control signal CTRL is a digital signal of N-bits and is increased or decreased in response to the signal output from the comparator 232. The control signal CTRL is received as an input to the delay circuit 210 for controlling the time delay applied by the delay circuit 210.

According to the exemplary embodiment of the present invention, the time delay produced by the delay circuit 210 is controlled by the control signal CTRL that, in turn corresponds to the phase difference detected between the first clock signal CLK1 and the delayed clock signal CLKD. Moreover, the XOR device 220 performs an XOR operation on the first clock signal CLK1 and the delayed clock signal CLKD to generate the second clock signal CLK2 that has a multiplied frequency and an accurate duty cycle.

Figure 3:
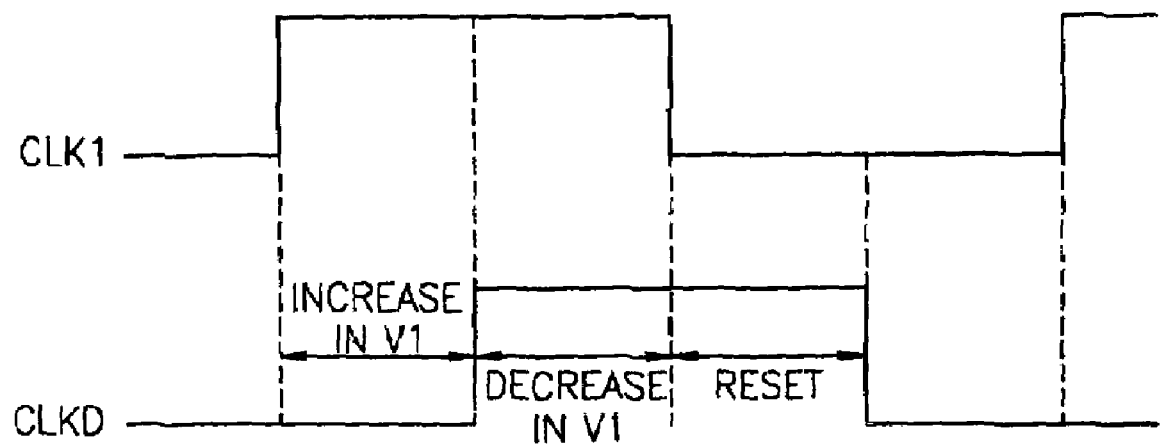
FIG. 3 is a timing diagram showing periods during which levels of a first voltage and a second voltage change in relation to the timings of an input clock signal and a delayed clock signal, according to an exemplary embodiment of the present invention.

FIG. 3 is a timing diagram showing periods during which the levels of the first voltage V1 and the second voltage V2 change in relation to the timings of the first clock signal CLK1 and the delayed clock signal CLKD, according to the present invention.

As illustrated in FIG. 3, there are three periods, i.e., a first period, a second period, and a third period based on changes in the timings of the first clock signal CLK1 and the delayed clock signal CLKD. The first period, during which the first voltage V1 increases, the first clock signal CLK1 is high, and the delayed clock signal CLKD is low. The second period, during which the first voltage V1 decreases, both the first clock signal CLK1 and the delayed clock signal CLKD are high. The third period, during which the first voltage V1 and the second voltage V2 are reset to the same level, the first clock signal CLK1 is low and the delayed clock signal CLKD is high.

The operation of the phase detector 231 during each of the periods illustrated in FIG. 3 will be further described with reference to FIG. 4 which illustrates an exemplary embodiment of the phase detector 231 suitable for use in the exemplary frequency multiplier illustrated in FIG. 2. The phase detector 400 of FIG. 4 includes a first voltage control unit 410, a second voltage control unit 420, and, preferably, a reset unit 430 for setting the first voltage V1 and the second voltage V2 to the same level.

The first voltage control unit 410 receives the first clock signal CLK1 and the delayed clock signal CLKD, and controls the level of the first voltage V1 in response to logic states of the received signals. The first voltage control unit 410 includes a plurality of logic circuits 411–418, and a PMOS transistor MP41, an NMOS transistor MN43, and a reset signal generating unit 40.

The logic circuit 417, functioning as an inversion circuit (hereinafter, referred to as the inversion circuit 417), receives the delayed clock signal CLKD and outputs an inverted, delayed clock signal CLKDB to the logic circuit 411. The logic circuit 411 receives the first clock signal CLK1 and the inverted, delayed clock signal CLKDB, performs a NAND operation on the received signals, and outputs the result of the NAND operation to the logic circuit 415. The logic circuit 412 receives the first clock signal CLK1 and the delayed clock signal CLKD, performs an AND operation on the received signals, and outputs the result of the AND operation to the logic circuit 414.

The reset signal generating unit 40 includes the logic circuit 418, functioning as an inversion circuit (hereinafter, referred to as the inversion circuit 418), and the logic circuit 413. The inversion circuit 418 receives the first clock signal CLK1 and outputs an inverted first clock signal CLK1B to the logic circuit 413. The logic circuit 413 receives the inverted first clock signal CLK1B and the delayed clock signal CLKD, performs an AND operation on the received signals, and outputs a reset signal LD.

The logic circuit 416, functioning as an inversion circuit (hereinafter, referred to as the inversion circuit 416), receives and inverts the reset signal LID and outputs an inverted reset signal LDB1 to the logic circuit 415. The logic circuit 415 receives the output of the logic circuit 411 and the inverted reset signal LDB1 of the inversion circuit 416, performs an AND operation on the received signals, and outputs the result of the AND operation. The logic circuit 414 receives the output of the logic circuit 412 and the reset signal LD, performs an AND operation on the received signals, and outputs the result of the AND operation.

The PMOS transistor MP41 has a gate connected to the output terminal of logic circuit 415, a source connected to a supply voltage VDD, and a drain connected to the drain of the NMOS transistor MN43. The voltage at a common connection node for the drains of the PMOS transistor MP41 and the NMOS transistor MN43 is equal to the first voltage V1. The NMOS transistor MN43 has a gate connected to the output terminal of the logic circuit 414 and a source connected to a ground voltage VSS.

The second voltage control unit 420 receives the reset signal LD and controls the level of the second voltage V2 in response to the reset signal LD. The second voltage control unit 420 includes a plurality of logic circuits 421, 422 and 423, a PMOS transistor MP42, and an NMOS transistor MN45.

The logic circuit 423, functioning as an inversion circuit (hereinafter, referred to as the inversion circuit 423), receives and inverts the reset signal LD and outputs an inverted reset signal LDB2 to the logic circuit 421. The logic circuit 421 receives the inverted reset signal LDB2 and a supply voltage (VDD) signal, performs an AND operation on the received signals, and outputs the result of the AND operation. Since the VDD signal is always high, the logic circuit 421 operates as a buffer for the inverted reset signal LDB2 of the inversion circuit 423.

The logic circuit 422 receives the reset signal LD and a ground voltage (VSS) signal, performs an AND operation on the received signals, and outputs the result of the AND operation. Since the VSS signal is always low, the logic circuit 422 operates as a buffer for the reset signal LD.

The PMOS transistor MP42 has a gate connected to the output terminal of the logic circuit 421, a source connected to the supply voltage VDD, and a drain connected to the drain of the NMOS transistor MN45. The voltage at a common connection node for the drains of the PMOS transistor MP42 and the NMOS transistor MN45 is equal to the second voltage V2. The NMOS transistor MN45 has a gate connected to the output terminal of the logic circuit 422 and a source connected to the supply voltage VSS.

Figure 4:
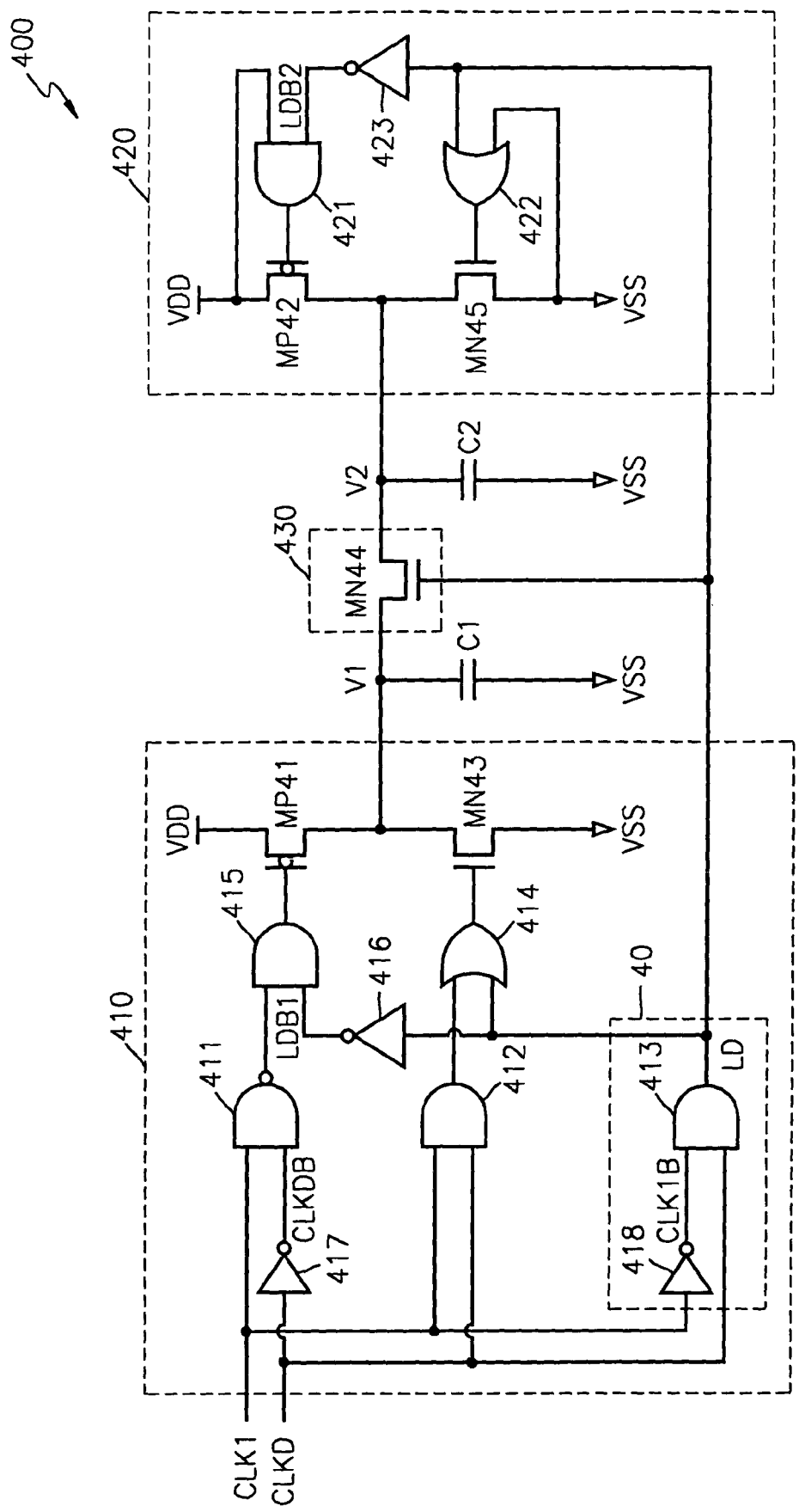
FIG. 4 illustrates an exemplary embodiment of a phase detector suitable for use in the frequency multiplier of FIG. 2.

As illustrated in FIG. 4, the reset unit 430 includes of an NMOS transistor MN44 that has a gate receiving the reset signal LD, a drain connected to the first voltage V1 node, and a source connected to the second voltage V2 node. A first capacitor C1, which supplies charges to the first voltage V1, is connected between the first voltage V1 node and the ground voltage VSS. A second capacitor C2, which supplies charges to the second voltage V2, is connected to the second voltage V2 node and the ground voltage VSS.

The operation of the phase detector 400 illustrated in FIGS. 3 and 4 will be described in detail. During the first period, when the first clock signal CLK1 is high and the delayed clock signal CLKD is low, the inversion circuit 417 outputs the inverted, delayed clock signal CLKDB as high to the logic circuit 411, the logic circuit 411 outputs a low signal to the logic circuit 415, and the logic circuit 415 outputs a low signal.

Similarly, during the first period the logic circuit 412 outputs a low signal, the reset signal generating unit 40 outputs the reset signal LD as low, and the logic circuit 414 outputs a low signal.

Since the logic circuits 415 and 414 output low signals, the PMOS transistor MP41 is turned on, and the NMOS transistor MN43 is turned off. As a result, charging of the first capacitor C1 is initiated, and the first voltage V1 increases. That is, during the first period, the first voltage control unit 410 operates to increase the first voltage V1. However, because the reset signal LD is low, the logic circuit 421 outputs a high signal and the logic circuit 422 outputs a low signal. As a result, the PMOS transistor MP42 and the NMOS transistor MN45 are turned off. So, the level of the second voltage V2 remains constant, and the reset unit 430 remains inactive.

During the second period when the first clock signal CLK1 and the delayed clock signal CLKD are both high, the inversion circuit 417 outputs the inverted, delayed clock signal CLKDB as low to the logic circuit 411 and the logic circuit 411 outputs a high signal to the logic circuit 415.

Similarly, during the second period the logic circuit 412 outputs a high signal, the reset signal generating unit 40 outputs the reset signal LD as low. Thus, the logic circuit 416 outputs a high signal to the logic circuit 415 and the logic circuit 415 outputs a high signal.

In this case, since the PMOS transistor MP41 is turned off and the NMOS transistor MN43 is turned on, the charge stored in the first capacitor C1 begin to be discharged through the NMOS transistor MN43 and the first voltage V1 decreases. That is, during the second period, the first voltage control unit 410 operates to decrease the first voltage V1. However, because the reset signal LD is low, the level of the second voltage V2 remains the same and the reset unit 430 remains inactive as in the first period.

During the third period, however, the first clock signal CLK1 is low and the delayed clock signal CLKD is high causing the logic circuit 411 to output a high signal to logic circuit 415 and logic circuit 412 to output a low signal to logic circuit 414. Further, because the reset signal LD is generated by performing an AND operation on the inverted first clock signal CLK1B and the delayed clock signal CLKD, the reset signal LD is high. As a result, the logic circuit 415 outputs a low signal and the logic circuit 414 outputs a high signal.

In this case, because the PMOS transistor MP41 and the NMOS transistor MN43 are turned on, the first capacitor C1 is simultaneously charged by the PMOS transistor MP41 and discharged by the NMOS transistor MN43. As a result, the first voltage V1 remains substantially constant.

In addition, because the reset signal LD is high, the logic circuit 421 outputs a low signal and the logic circuit 422 outputs a high signal, activating both the PMOS transistor MP42 and the NMOS transistor MN45 and causing the second capacitor C2 to be simultaneously charged by the PMOS transistor MP42 and discharged by the NMOS transistor MN45. As a result, the second voltage V2 remains substantially constant.

As described above, when the reset signal LD is high, the first voltage control unit 410 and the second voltage control unit 420 operate to control the levels of the first voltage V1 and the second voltage V2. In order to maintain the first voltage V1 and the second voltage V2 at a substantially constant level, widths can be designed to balance the PMOS transistor MP41 and the NMOS transistor MN43 of the first voltage control unit 410 and the PMOS transistor MP42 and the NMOS transistor MN45 of the second voltage control unit 420.

When the reset signal LD is high, the first voltage V1 and the second voltage V2 are preferably identical. As shown in FIG. 4, the phase detector 400 may include a reset unit 430 for maintaining the first voltage V1 and the second voltage V2 at a same level. Referring to FIG. 4, when the reset signal LD is activated, the NMOS transistor MN44 is turned on. As a result, the first voltage V1 and the second voltage V2 are maintained at substantially the same level.

As shown in FIGS. 3 and 4, the phase detector 400 detects the phase difference between the first clock signal CLK1 and the delayed clock signal CLKD, and outputs the first voltage V1 and the second voltage V2 based on the detected result. In addition to this, the phase detector 400 is configured to generate a reset signal LD during a single cycle of the first clock signal CLK1 and maintain the first voltage V1 and the second voltage V2 at the same level when the reset signal LD is high.

Figure 5:
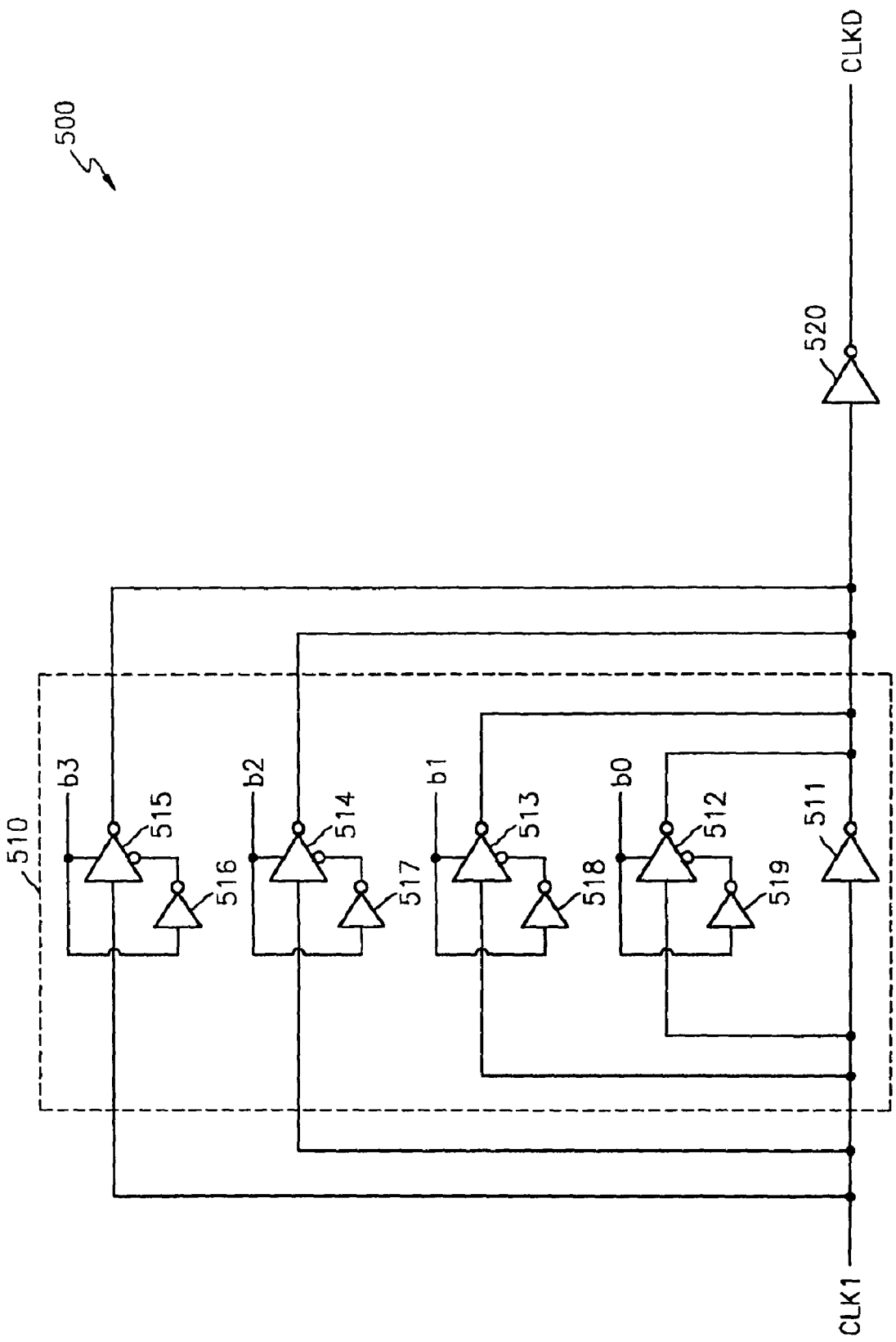
FIG. 5 illustrates a first exemplary embodiment of the delay circuit included in the frequency multiplier of FIG. 2.

The frequency multiplier 200 illustrated in FIG. 2 adjusts the duty cycle of a clock signal with a multiplied frequency by controlling the time delay applied by the delay circuit 210 using the first voltage V1 and the second voltage V2 output from the phase detector 400. FIG. 5 illustrates a first exemplary embodiment of the delay circuit 210 useful in the frequency multiplier 200. The delay circuit 500 includes an inversion circuit group 510, and an inversion circuit 520 for converting output signals of the inversion circuit group 510. The delay circuit 500 may include one or more inversion circuit groups, each of which is configured in a manner similar to that illustrated for inversion circuit group 510. The delay circuit 500 receives the first clock signal CLK1 and outputs the delayed clock signal CLKD whose time delay is changed in response to a digital signal of N-bits (N is four in FIG. 5), i.e., "b3", "b2", "b1", and "b0", output from the counter 233 of FIG. 2.

The inversion circuit group 510 includes a plurality of inversion circuits 511–519. The input terminal of the inversion circuit 511 is connected to the input terminals of the inversion circuits 512, 513, 514 and 515, and the output terminal of the inversion circuit 511 is connected to the output terminal of the inversion circuits 512, 513, 514 and 515 and the input terminal of the inversion circuit 520.

The inversion circuit 516 inverts b3 of the digital signal output from the counter 233 of FIG. 2 and outputs an inverted signal. Similarly inversion circuit 517 inverts b2 of the digital signal output from the counter 233, inversion circuit 518 inverts b1 of the digital signal output from the counter 233 and inversion circuit 519 inverts b0 of the digital signal output from the counter 233, each of the inversion circuits outputting an inverted signal.

The inversion circuit 515 is activated in response to the b3 output from the counter, the inversion circuit 514 is activated in response to the b2 output from the counter 233, the inversion circuit 513 is activated in response to the b1 output from the counter 233, and the inversion circuit 512 is activated in response to the b0 output from the counter 233. In other words, the inversion circuits 512, 513, 514 and 515 are respectively activated in response to the b0, b1, b2 and b3 outputs from the counter 233.

Based on phase information detected by the phase detector 231 and the comparator 233 illustrated in FIG. 2, the counter 233 outputs the digital signal composed of bits "b3", "b2", "b1" and "b0" that enables control of the time delay applied by the delay circuit 500. If the inversion circuits 512, 513, 514 and 515 are simultaneously activated, the operation of the inversion circuit group 510 is performed more rapidly, thus reducing the time delay of the delayed clock signal CLKD.

As illustrated in FIG. 5, because inversion circuits 515, 514, 513 and 512 are activated when the bits of the digital signal output from the counter are high, the time delay is greatest when all of the bits of the digital signal output from the counter are low. Conversely, the time delay is smallest when all of the bits of the digital signal output from the counter are high.

In order to provide more linear control of the time delay applied to the delayed clock signal CLKD based on the logic states of the bits "b3", "b2", "b1" and "b0" output from the counter 233, the relative sizes of the inversion circuits 515, 514, 513 and 512 can be adjusted. Because the inversion circuits 515, 514, 513 and 512 are composed of MOS transistors, the performance of the inversion circuits 515, 514, 513 and 512 may be controlled by the sizing of the MOS transistor included in each of the inversion circuits 515, 514, 513 and 512.

Figure 6:
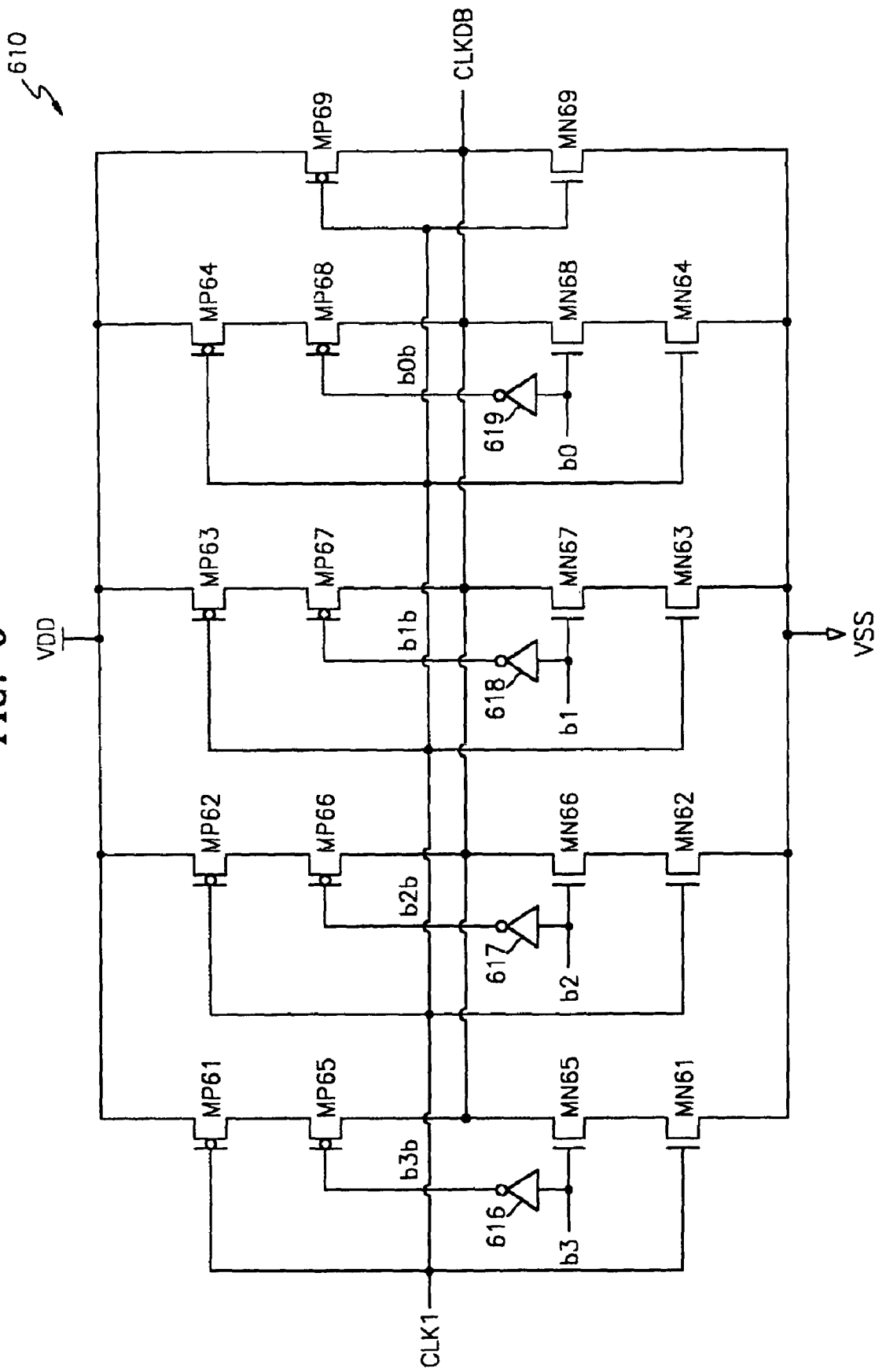
FIG. 6 is a circuit diagram showing an exemplary embodiment of an inversion circuit group suitable for use in the delay circuit of FIG. 5.

FIG. 6 is a circuit diagram illustrating an exemplary embodiment of an inversion circuit group 510 suitable for use in the delay circuit 500 of FIG. 5 according to the present invention. An inversion circuit group 610 of FIG. 6 includes a plurality of NMOS transistors and PMOS transistors. The sources of PMOS transistors MP61, MP62, MP63, MP64 and MP69 are connected to the supply voltage VDD, and sources of NMOS transistors MN61, MN62, MN63, MN64 and MN69 are connected to the ground voltage VSS. Gates of the PMOS transistors MP61, MP62, MP63, MP64 and MP69 and the NMOS transistors MN61, MN62, MN63, MN64 and MP69 are connected to the first clock signal CLK1.

The drain of the PMOS transistor MP69 is connected to the drain of the NMOS transistor MN69. The inverted, delayed clock signal CLKDB is output from the common connection node for the drains of the PMOS transistor MP69 and the NMOS transistor MN69.

The gate of the NMOS transistor MN65 is connected to the "b3" output from the counter 233, the gate of the NMOS transistor MN66 is connected to the "b2" output from the counter 233, the gate of the NMOS transistor MN67 is connected to the "b1" output from the counter, and the gate of the NMOS transistor MN68 is connected to the "b0".

The inversion circuit 616 inverts the "b3" output from the counter 233 and outputs an inverted "b3b" signal. Similarly, inversion circuit 617 inverts the "b2" output from the counter 233 and outputs an inverted "b2b" signal, inversion circuit 618 inverts the "b1" output from the counter 233 and outputs an inverted "b1b" signal and inversion circuit 619 inverts the "b0" output from the counter 233 and outputs an inverted "b0b" signal.

The gate of the PMOS transistor MP65 is connected to the inverted "b3b" output. Similarly, the gate of PMOS transistor MP66 is connected to the inverted "b2b" output, the gate of PMOS transistor MP67 is connected to the inverted "b1b" output, and the gate of PMOS transistor MP68 is connected to the inverted "b0b" output.

The source of the PMOS transistor MP65 is connected to the drain of the PMOS transistor MP61. The drain of the PMOS transistor MP65 is connected to the drain of the NMOS transistor MN65. The source of the PMOS transistor MP66 is connected to the drain of the PMOS transistor MP62. The drain of the PMOS transistor MP66 is connected to the drain of the NMOS transistor MN66. The source of the PMOS transistor MP67 is connected to the drain of the PMOS transistor MP63. The drain of the PMOS transistor MP67 is connected to the drain of the NMOS transistor MN67. The source of the PMOS transistor MP68 is connected to the drain of the PMOS transistor MP64. The drain of the PMOS MP68 is connected to the drain of the NMOS transistor MN68.

The operation of the inversion circuit group 610 will be described in more detail with reference to FIG. 6.

The digital signal bits "b3", "b2", "b1" and "b0" output from the counter 233 respectively have predetermined logic states. In response to the logic states of the bits output from the counter, the PMOS transistors MP65, MP66, MP67 and MP68 and the NMOS transistors MN65, MN66, MN67 and MN68 are turned on or off. Once the PMOS transistors MP65, MP66, MP67 and MP68 and the NMOS transistors MN65, MN66, MN67 and MN68 are turned on, the inversion circuits that are connected to these transistors are activated, resulting in a reduced time delay. Conversely, when the PMOS transistors MP65, MP66, MP67 and MP68 and the NMOS transistors MN65, MN66, MN67 and MN68 are turned off, the inversion circuits which are connected to these transistors stop operation, resulting in an increased time delay.

Assuming, for example, that the digital signal of N-bits output from the counter has logic states "b3"=0, "b2"=1, "b1"=0 and "b0"=0, the inverted digital signal of N-bit output from the counter has logic states "b3b"=1, "b2b"=0, "b1b"=1 and "b0b"=1. Thus, this particular output from the counter results will cause PMOS transistors MP65, MP67 and MP68 to be turned off and the PMOS transistor MP66 to be turned on, NMOS transistors MN65, MN67 and MN68 to be turned off and the NMOS transistor MN66 to be turned on.

In this example, the PMOS transistors MP61, MP63 and MP64 and the NMOS transistors MN61, MN63 and MN64 are turned off, and the PMOS transistors MP62 and MP69 and the NMOS transistors MN62 and MN69 function as inversion circuits and output the inverted, delayed clock signal CLKDB.

Because the amount of current flowing from the input terminal to the output terminal of the inversion circuit group 510 increases when the "b2" is high, the time delay at that moment is smaller than when the PMOS transistor MP69 and the NMOS transistor MN69 operate. In other words, the delay circuit 500 of FIG. 5 and the inversion circuit group 610 included therein can control the time delay applied to the first clock signal by the delay circuit 500 based on the logic states of the digital signal bits output from the counter 233 of FIG. 2. In this way, the time delay applied by the delay circuit can be controlled based on the logic states of the digital signal bits "b3", "b2", "b1" and "b0" output from the counter.

Figure 7:
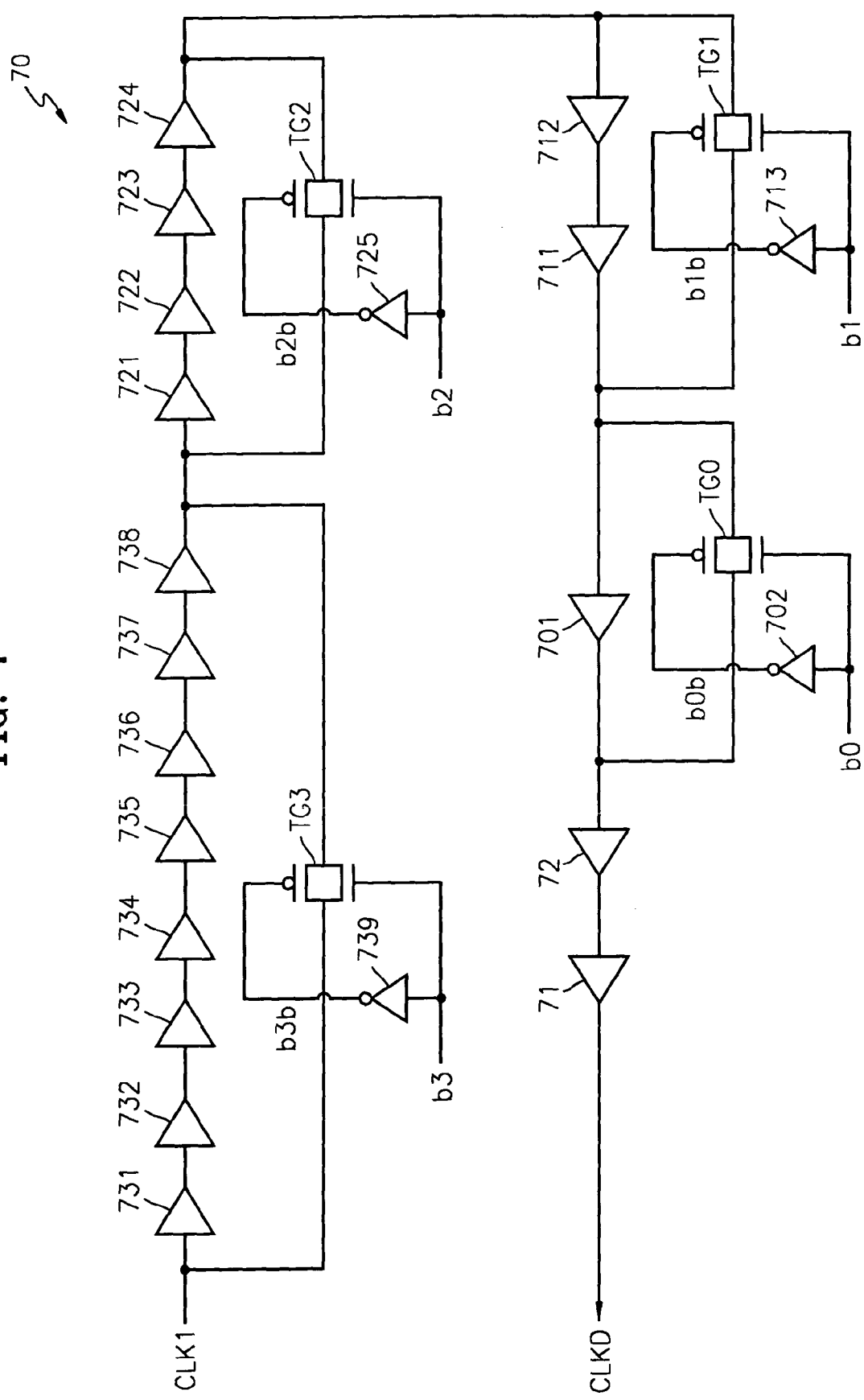
FIG. 7 illustrates a second exemplary embodiment of a delay circuit suitable for use in the frequency multiplier of FIG. 2.

FIG. 7 illustrates a second exemplary embodiment of the delay circuit 210 that may be utilized in the frequency multiplier 200 of FIG. 2 according to the present invention. In contrast to the delay circuit 500 illustrated in FIG. 5, the delay circuit 70 of FIG. 7 includes a plurality of buffers 731–738, connected in series, a plurality of buffers 721, 722, 723 and 724, connected in series, buffers 711 and 712, connected in series, a buffer 701, and switches TG3, TG2, TG1 and TG0. One buffer is the equivalent circuit to two inversion circuits connected in series.

When "b3" output from the counter is high, the switch TG3 will be switched on to short the input terminal of the buffer 731 and the output terminal of the buffer 738. When the "b2" output from the counter 233 is high, the switch TG2 is switched on to short the input terminal of the buffer 721 and an output terminal of the buffer 724. When "b1" is high, the switch TG1 is switched on to short the output terminal of the buffer 711 and the input terminal of the buffer 712. When "b0" is high, the switch TG0 is switched on to short input and output terminals of the buffer 701.

The inversion circuits 739, 725, 713 and 702 generate the inverted "b3b", "b2b", "b1b" and "b0b" signals from the "b3", "b2", "b1" and "b0" signals, respectively. The buffers 71 and 72 are serially connected to the buffer 701. The buffer 71 outputs the delayed clock signal CLKD.

The delay circuit 70 of FIG. 7 operates as follows. The switches TG3, TG2, TG1 and TG0 are switched off when the bits "b3", "b2", "b1" and "b0" output from counter 233 are low. Assuming that the buffers 731–738, 721–724, 711, 712, 701, 71 and 72 apply the same time delay, e.g., D, to the first clock signal CLK1, the time delay between the first clock signal CLK1 and the delayed clock signal CLKD is equal to 8D+4D+2D+1D+2D=17D. Conversely, when the bits "b3", "b2", "b1" and "b0" output from the counter are high, the switches TG3, TG2, TG1 and TG0 are switched on. Thus, the time delay between the first clock signal CLK1 and the delayed clock signal CLKD is equal to 2D. As will be appreciated, the time delay varies between 2D and 17D with changes in the logic states of the bits "b3", "b2", "b1" and "b0" output from the counter 233. Although two suitable exemplary delay circuits, specifically delay circuit 500 as illustrated in FIGS. 5 and 6 and delay circuit 70 as illustrated in FIG. 7 have been disclosed, those of skill in the art will be able to select or design other suitable delay circuit configurations.

As described above, the frequency multiplier and the associated method allows the duty cycle of a clock signal with a multiplied frequency to be adjusted by controlling the time delay applied by a delay circuit in response to a control signal.

In addition, the difference between the first voltage and the second voltage is changed with respect to a phase difference between a first clock signal and a delayed clock signal. The time delay is controlled based on the detected change in the difference between the first voltage and the second voltage. Further, because a reset signal, which is used to maintain the first voltage and the second voltage at a same level, is generated within each cycle of the first clock signal, an additional reset signal is not needed.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A frequency multiplier comprising:
    a delay circuit that receives a first clock signal having a first frequency and outputs a delayed clock signal, the delay circuit producing the delayed clock signal by applying a time delay to the first clock signal;
    an XOR gate that receives the first clock signal and the delayed clock signal, performs an XOR operation on the first clock signal and the delayed clock signal, and outputs a second clock signal; and
    a control circuit that detects a phase difference between the first clock signal and the delayed clock signal, and outputs a control signal to the delay circuit corresponding to the detected phase difference, the control signal being generated with respect to an internal first voltage and an internal second voltage reflecting the detected phase difference,
    wherein the control signal controls a duration of the time delay applied to the first clock signal by the delay circuit, the control signal is increased or decreased in response to a logic signal.

2. A frequency multiplier according to claim 1, wherein:
the control signal includes a plurality of bit signals corresponding to the detected phase difference, each bit signal having a logic state.

3. A frequency multiplier according to claim 1, wherein:
the control circuit includes
    a phase detector that receives the first clock signal and the delayed clock signal and outputs the first voltage and the second voltage, the first and second voltages corresponding to the detected phase difference between the first clock signal and the delayed clock signal;
    a comparator that compares the first voltage and the second voltage, generates a comparison result and outputs a logic signal having a predetermined logic state corresponding to the comparison result; and
    a counter that outputs the control signal in synchronization with the first clock signal, wherein the logic state of a plurality of bit signals correspond to the logic signal output from the comparator.

4. A frequency multiplier according to claim 3, wherein:
the phase detector includes
    a first voltage control unit that receives the first clock signal and the delayed clock signal and controls the first voltage in response to logic states of the first clock signal and the delayed clock signal, and
    a reset signal generating unit that generates a reset signal using the first clock signal and the delayed clock signal;
    a reset unit that sets the first voltage and the second voltage at a reset voltage level in response to the reset signal; and
    a second voltage control unit that receives the reset signal and controls the second voltage in response to the reset signal.

5. A frequency multiplier according to claim 4, wherein:
the first voltage control unit increases the first voltage when the first clock signal has a first logic state and the delayed clock signal has a second logic state;
the first voltage control unit decreases the first voltage when the first clock signal and the delayed clock signal have the first logic state; and
when the first clock signal has the second logic state, the first voltage control unit and the second voltage control unit set the first voltage and the second voltage to a reset voltage.

6. A frequency multiplier according to claim 1, wherein:
the control signal includes a plurality of bit signals, each bit signal having a logic state,
wherein the duration of the time delay applied to the first clock signal by the delay circuit corresponds to the logic states of the bit signals.

7. A frequency multiplier according to claim 6, wherein:
the delay circuit includes a plurality of inversion circuit groups, the inversion circuit groups being serially connected between input and output terminals of the delay circuit, and further wherein
each inversion circuit group includes a plurality of inversion circuits connected in parallel, an incremental time delay applied by each inversion circuit group is controlled in response to activation of the inversion circuits, in which at least one inversion circuit is activated in response to the control signal, the incremental time delays applied by each inversion group determining the time delay applied by the delay circuit.

8. The frequency multiplier of claim 1, wherein:
the second clock signal has a second frequency that is twice that of the first frequency.

9. A frequency multiplier comprising:
a delay circuit that receives a first clock signal, applies a time delay to the first clock signal and outputs a delayed clock signal;
a logic circuit that receives the first clock signal and the delayed clock signal, synthesizes the first clock signal and the delayed clock signal and outputs a second clock signal;
a phase detector that detects a phase difference between the first clock signal and the delayed clock signal and outputs a first voltage, wherein the first voltage corresponds to the detected phase difference, and a second voltage, wherein the second voltage is a reference voltage;
a comparator that compares the first voltage and the second voltage to generate a comparison result and outputs a logic signal corresponding to the comparison result; and a counter that outputs a digital signal to the delay circuit, the digital signal including N-bits having logic states corresponding to the logic signal,
wherein the digital signal is synchronized with the first clock signal, and further wherein the time delay applied by the delay circuit corresponds to the digital signal.

10. A frequency multiplier according to claim 9, wherein:
the first voltage increases during a first period of the first clock signal;
the first voltage decreases during a second period of the first clock signal; and
the level of the first voltage is set to be approximately equal to the second voltage during a third period of the first clock signal.

11. A frequency multiplier according to claim 10, wherein:
the first period starts at a rising edge of the first clock signal and ends at a rising edge of the delayed clock signal;
the second period starts at the rising edge of the delayed clock signal and ends at a falling edge of the first clock signal; and
the third period starts at the falling edge of the first clock signal and ends at a falling edge of the delayed clock signal.

12. A frequency multiplier according to claim 9, wherein:
a value of the digital signal of N-bits output from the counter is adjusted in response to the logic signal by changing the logic state of at least one of the N-bits of the digital signal.

13. A frequency multiplier according to claim 9, wherein:
the first clock signal has a first frequency; and
the second clock signal has a second frequency, wherein the second frequency is twice that of the first frequency.

14. A method of frequency multiplication comprising:
(a) receiving a first clock signal and applying a time delay to the first clock signal to generate a delayed clock signal;
(b) performing an XOR operation on the first clock signal and the delayed clock signal to generate a second clock signal;
(c) detecting a phase difference between the first clock signal and the delayed clock signal and generating a digital control signal corresponding to the detected phase difference, the digital control signal being generated with respect to an internal first voltage and an internal second voltage reflecting the detected phase difference; and
(d) increasing or decreasing the digital control signal in response to a logic signal;
(e) using the digital control signal to set a duration of the time delay applied to the first clock signal.

15. A method of frequency multiplication according to claim 14, wherein:
receiving the first clock signal and applying a time delay to the first clock signal to generate the delayed clock signal includes
receiving the digital control signal; and
setting a duration of the time delay according to a logic state of the digital control signal.

16. A method of frequency multiplication according to claim 14, wherein:
detecting a phase difference between the first clock signal and the delayed clock signal and generating a digital control signal corresponding to the detected phase difference includes
(c1) receiving the first clock signal and the delayed clock signal;
(c2) generating the first voltage and the second voltage corresponding to the detected phase difference;
(c3) comparing the first voltage and the second voltage to generate a voltage comparison result;
(c4) generating a logic signal having a predetermined logic state corresponding to the voltage comparison result;
(c5) setting the logic state of the digital control signal to correspond to the logic signal; and
(c6) outputting the digital control signal in synchronization with the first clock signal.

17. A method of frequency multiplication according to claim 16, wherein:
setting the logic state of the digital control signal to correspond to the logic signal includes
(c51) incrementing or decrementing a value of the digital control signal in response to the logic signal.

18. A method of frequency multiplication according to claim 16, wherein:
generating the first voltage and the second voltage corresponding to the detected phase difference includes
increasing the first voltage when the first clock signal has a first logic state and the delayed clock signal has a second logic state; and
decreasing the first voltage when the first clock signal has the first logic state and the delayed clock signal has the first logic state.

19. A method of frequency multiplication according to claim 18, wherein:
generating the first voltage and the second voltage corresponding to the detected phase difference includes
setting the first voltage and the second voltage to a reset voltage value when the first clock signal has the second logic state.

20. A method of frequency multiplication according to claim 14, wherein:
(a) receiving a first clock signal and applying a time delay to the first clock signal to generate a delayed clock signal includes inputting a first clock signal into a delay circuit and outputting a delayed clock signal from the delay circuit;
(b) performing an XOR operation on the first clock signal and the delayed clock signal to generate a second clock signal includes inputting the first clock signal and the delayed clock signal into a XOR circuit and outputting a second clock signal from the XOR circuit;

(c) detecting a phase difference between the first clock signal and the delayed clock signal and generating a digital control signal corresponding to the detected phase difference includes inputting the first clock signal and the delayed clock signal into a phase detector and outputting the first voltage and the second voltage from the phase detector, sensing the first voltage and the second voltage in a comparator and outputting a logic signal from the comparator, inputting the first clock signal and the logic signal into a counter and outputting a digital control signal; and (d) using the digital control signal to set a duration of the time delay applied to the first clock signal includes using the logic state of N-bits included in the digital control signal to activate at least one of a plurality of inversion circuits, wherein the duration of the time delay applied to the first clock signal corresponds to the activated inversion circuits.

21. A method of frequency multiplication comprising:
(a) receiving a first clock signal and applying a time delay to the first clock signal to generate a delayed clock signal;
(b) performing an XOR operation on the first clock signal and the delayed clock signal to generate a second clock signal;
(c) detecting a phase difference between the first clock signal and the delayed clock signal and generating a digital control signal corresponding to the detected phase difference; and
(d) using the digital control signal to set a duration of the time delay applied to the first clock signal,
wherein (c) further includes,
comparing a first voltage corresponding to the first clock signal to a second voltage corresponding to the delayed clock signal;
outputting a signal to increase the level of the digital control signal if the difference between the first and second voltages is greater than a threshold value, and outputting a different signal to decrease the digital control signal level if the difference between the first and second voltages is less than the threshold value.

* * * * *